United States Patent
Epperson et al.

(10) Patent No.: US 9,933,459 B1
(45) Date of Patent: Apr. 3, 2018

(54) MAGNETICALLY COUPLED GROUND REFERENCE PROBE

(71) Applicant: Fluke Corporation, Everett, WA (US)

(72) Inventors: David L. Epperson, Everett, WA (US); Jeffrey Worones, Seattle, WA (US); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 15/400,152

(22) Filed: Jan. 6, 2017

Related U.S. Application Data

(60) Provisional application No. 62/421,124, filed on Nov. 11, 2016.

(51) Int. Cl.
   *G01R 1/06* (2006.01)
   *G01R 15/12* (2006.01)

(52) U.S. Cl.
   CPC .................. *G01R 15/125* (2013.01)

(58) Field of Classification Search
   CPC ...... G01R 1/06722; G01R 1/26; G01R 15/12; G01R 15/125; G01R 1/073; G01R 31/28
   See application file for complete search history.

(56) References Cited

U.S. PATENT DOCUMENTS

| | | |
|---|---|---|
| 5,473,244 A | 12/1995 | Libove et al. |
| 5,583,444 A | 12/1996 | Nakamura et al. |
| 5,973,501 A | 10/1999 | Reichard |
| 6,004,029 A * | 12/1999 | Moslehi ............ G01J 5/10 219/390 |
| 6,014,027 A | 1/2000 | Reichard |
| 6,118,270 A | 9/2000 | Singer et al. |
| 6,664,708 B2 | 12/2003 | Shlimak et al. |
| 6,812,685 B2 | 11/2004 | Steber et al. |
| 6,825,649 B2 | 11/2004 | Nakano |
| 7,084,643 B2 | 8/2006 | Howard et al. |
| 8,054,061 B2 | 11/2011 | Prance et al. |

(Continued)

FOREIGN PATENT DOCUMENTS

EP    1 249 706 B1    9/2007

OTHER PUBLICATIONS

Tsang et al., "Dual capacitive sensors for non-contact AC voltage measurement," *Sensors and Actuators A* 167:261-266, 2011.

*Primary Examiner* — Son Le
(74) *Attorney, Agent, or Firm* — Seed IP Law Group LLP

(57) ABSTRACT

Systems and methods of providing a magnetically coupled ground reference probe for use with test equipment, such as digital multimeters (DMMs). The magnetically coupled ground reference probes disclosed herein may be used instead of a typical test probe or alligator clip. A magnetically coupled ground reference probe may be provided which includes an insulative housing surrounding a conductive magnet such as a permanent magnet or an electromagnet. The magnet may autonomously retract into a cavity of the insulative housing when not coupled to a ground reference so that the magnet does not contact a high potential source when being handled by the operator. In at least some implementations, at least a portion of the insulation material of the housing may be compressible to allow the magnet to come into physical contact with a ground reference surface while providing a sufficient creepage and clearance path.

21 Claims, 11 Drawing Sheets

(56) References Cited

U.S. PATENT DOCUMENTS

| | | | |
|---|---|---|---|
| 8,680,845 B2 | 3/2014 | Carpenter et al. | |
| 9,063,184 B2 | 6/2015 | Carpenter et al. | |
| 9,689,780 B2 * | 6/2017 | Chin | G01N 1/08 |
| 2002/0167303 A1 | 11/2002 | Nakano | |
| 2010/0090682 A1 | 4/2010 | Armstrong | |
| 2017/0089976 A1 * | 3/2017 | Neff | G01R 31/2891 |

* cited by examiner

MAGNETICALLY COUPLED GROUND REFERENCE PROBE

BACKGROUND

Technical Field

The present disclosure generally relates to testing of electrical and/or electronic measurement equipment, and more particularly, to magnetically coupled ground reference probes for such measurement equipment.

Description of the Related Art

Working in a high energy environment requires numerous safety precautions that limit the type of tools that can be used. The engineer or technician ("operator") in this environment may also be required to wear heavy and bulky personal protective equipment (PPE) gear which can inhibit the ability to manipulate tools. In order for many types of measurement equipment to function properly, a ground reference is required. For example, this can be in the form of a test lead for a digital multimeter (DMM). The test lead typically can accommodate a probe or alligator clip for connectivity. Probes and alligator clips have metal connection points that can potentially be hazardous if used improperly and are difficult to hold wearing heavy gloves.

Electrical test leads with measurement tools such as probes are used in conjunction with DMMs to manually connect the terminal blocks of a panel or circuit with the DMM to obtain the electrical measurement. When taking electrical measurements with present test leads, the operator normally needs to use two hands: one hand to hold the common or ground probe (typically black in color) and one hand to hold the positive voltage probe (typically red in color). Because of this, there are no free hands to hold and/or operate the DMM or to write or take notes.

Accordingly, it would be advantageous to provide a user with a safe and effective ground connection while also allowing at least one free hand when taking a voltage measurement from a control panel or other circuit.

BRIEF SUMMARY

A ground reference probe for use with a measurement device may be summarized as including a housing having a bottom rim and a downward facing recess extending upward from the bottom rim into the housing, the housing formed from an insulative material; an electrically-conductive magnet movably coupled to the housing, the magnet having a bottom face, and the magnet being movable between a raised position wherein the bottom face of the magnet is disposed within the recess above the bottom rim and a lowered position wherein the bottom face of the magnet is disposed proximate to the bottom rim; a biasing actuator operatively coupled to bias the magnet in the raised position, the biasing actuator exerting an upward force on the magnet which is less than a downward magnetic force exerted on the magnet when the bottom rim of the housing is disposed adjacent a ferromagnetic material; and a coupling conductor electrically coupled with the magnet, the coupling conductor sized and dimensioned to electrically couple with a test lead which is electrically coupleable with the measurement device. The biasing actuator may include a compression spring.

The ground reference probe may further include a flexible wire electrically coupled between the coupling conductor and the magnet. The housing may include a base portion and a cover portion, the base portion secured to the cover portion by at least one fastener. The housing may have a sidewall that may include opposing recesses which allow an operator to grasp the housing. The coupling conductor may be molded into a recess in a top surface of the housing. The recess of the housing may include an opening, and the magnet may include a boss which extends through the opening in the recess of the housing. The biasing actuator may include a compression spring disposed around at least a portion of the boss.

The boss of the magnet may include an opening, the ground reference probe may further include a fastener coupled to the magnet via the opening of the magnet, the fastener retaining the compression spring disposed around at least a portion of the boss of the magnet.

A measurement device may be summarized as including a measurement device body; a ground reference probe, comprising: a housing having a bottom rim and a downward facing recess extending upward from the bottom rim into the housing, the housing formed from an insulative material; an electrically-conductive magnet movably coupled to the housing, the magnet having a bottom face, and the magnet being movable between a raised position wherein the bottom face of the magnet is disposed within the recess above the bottom rim and a lowered position wherein the bottom face of the magnet is disposed proximate to the bottom rim; and a biasing actuator operatively coupled to bias the magnet in the raised position; and a test lead which physically and electrically couples the magnet of the ground reference probe to the measurement device body. The biasing actuator of the ground reference probe may include a compression spring. The housing of the ground reference probe may include a base portion and a cover portion, the base portion secured to the cover portion by at least one fastener. The housing of the ground reference probe may have a sidewall that includes opposing recesses which allow an operator to grasp the housing. The recess of the housing of the ground reference probe may include an opening, and the magnet may include a boss which extends through the opening in the recess of the housing. The biasing actuator of the ground reference probe may include a compression spring disposed around at least a portion of the boss.

The boss of the magnet of the ground reference probe may include an opening, the ground reference probe may further include a fastener coupled to the magnet via the opening of the magnet, the fastener retaining the compression spring disposed around at least a portion of the boss of the magnet.

A ground reference probe for use with a measurement device may be summarized as including an insulative housing having a base portion and a cover portion, the base portion coupled to the cover portion, the base portion comprising a bottom rim and a downward facing recess extending upward from the bottom rim; an electrically-conductive magnet movably coupled to the base portion of the housing, the magnet having a bottom face, and the magnet being movable between a raised position wherein the bottom face of the magnet is disposed within the recess above the bottom rim and a lowered position wherein the bottom face of the magnet is disposed proximate to the bottom rim; and a spring operatively coupled to bias the magnet in the raised position.

The ground reference probe may further include a coupling conductor electrically coupled with the magnet, the coupling conductor sized and dimensioned to electrically couple with a test lead which is electrically coupleable with the measurement device.

The ground reference probe may further include a flexible wire electrically coupled between the coupling conductor and the magnet. The recess of the housing may include an opening, the magnet may include a boss which extends through the opening in the recess of the housing, and the spring may be disposed around at least a portion of the boss.

The boss of the magnet may include an opening, the ground reference probe may further include a fastener coupled to the magnet via the opening of the magnet, the fastener retaining the spring disposed around at least a portion of the boss of the magnet.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
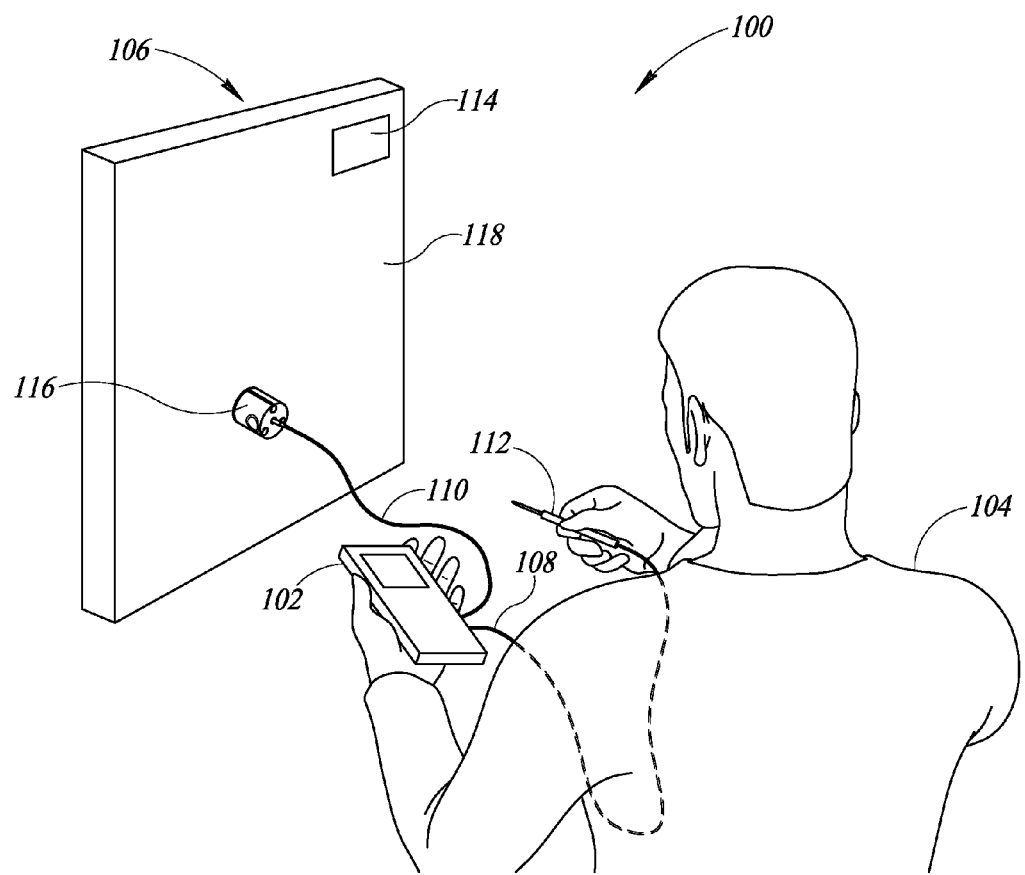
FIG. 1 is a pictorial diagram of an environment in which a magnetically coupled ground reference probe may be used by an operator to obtain a measurement of a circuit, according to one illustrated implementation.
Figure 2:
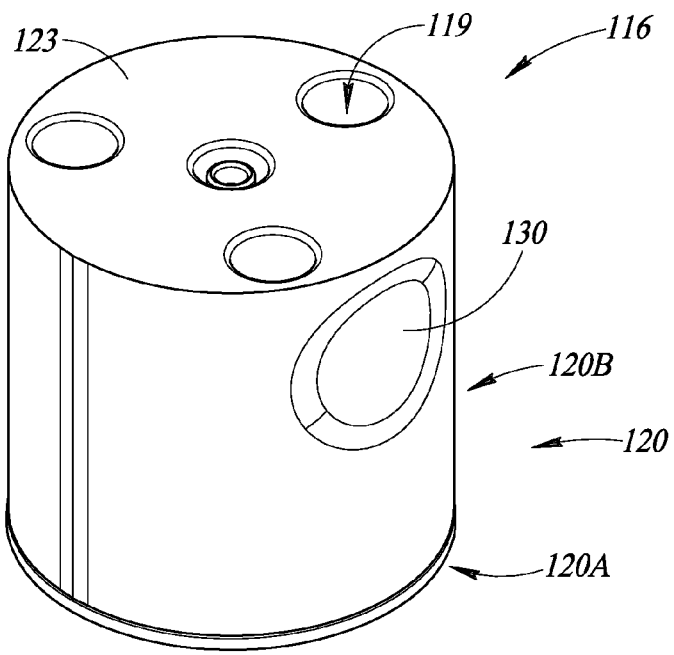
FIG. 2 is a top perspective view of the magnetically coupled ground reference probe shown in FIG. 1.
Figure 3:
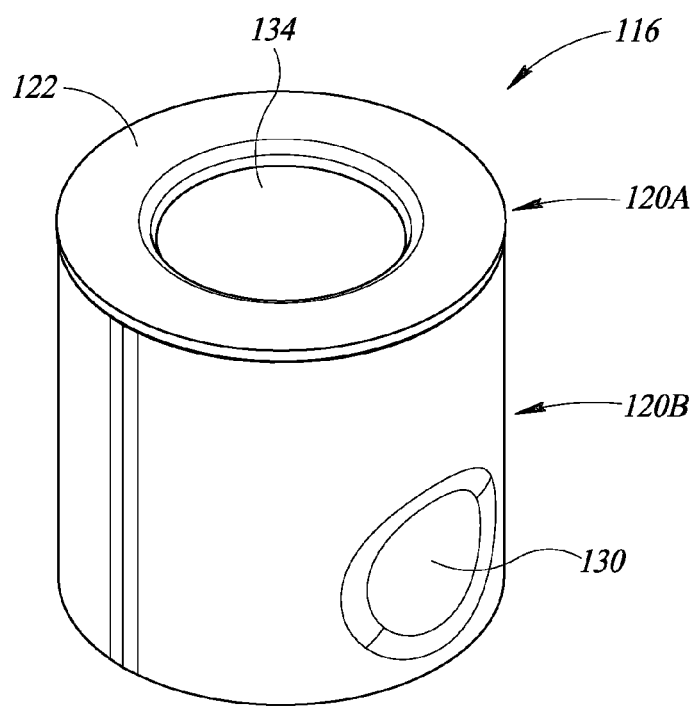
FIG. 3 is a bottom perspective view of the magnetically coupled ground reference probe.
Figure 4:
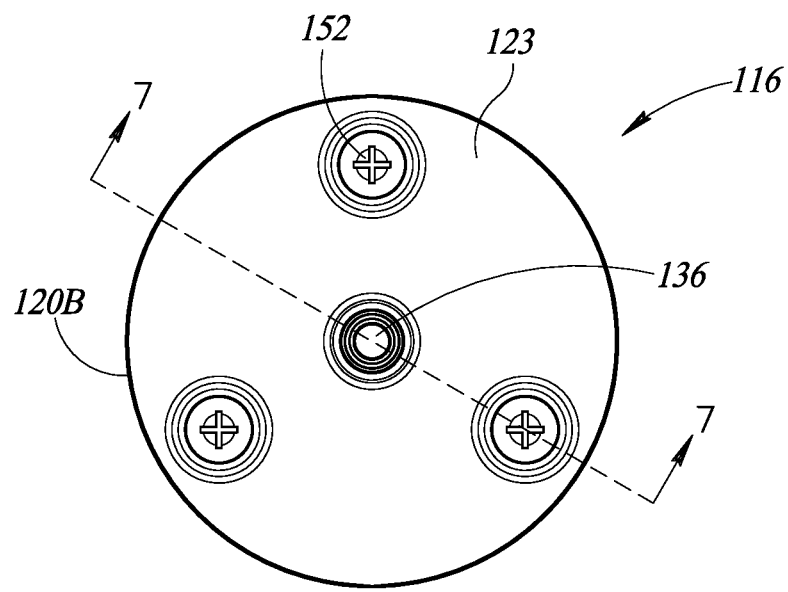
FIG. 4 is a top plan view of the magnetically coupled ground reference probe.
Figure 5:
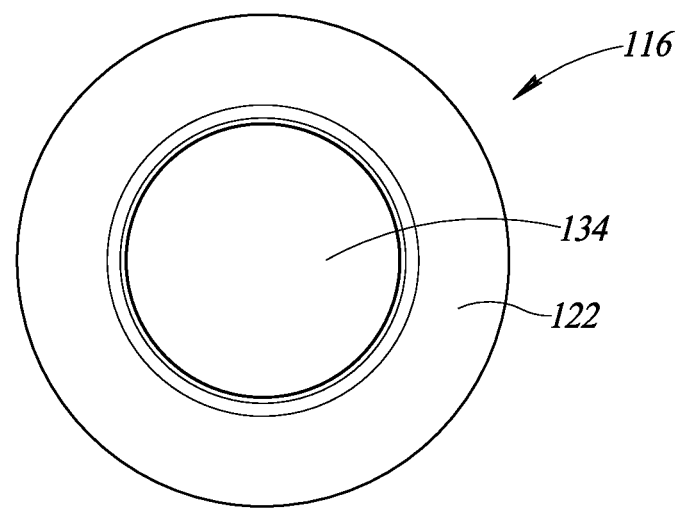
FIG. 5 is a bottom plan view of the magnetically coupled ground reference probe.
Figure 6:
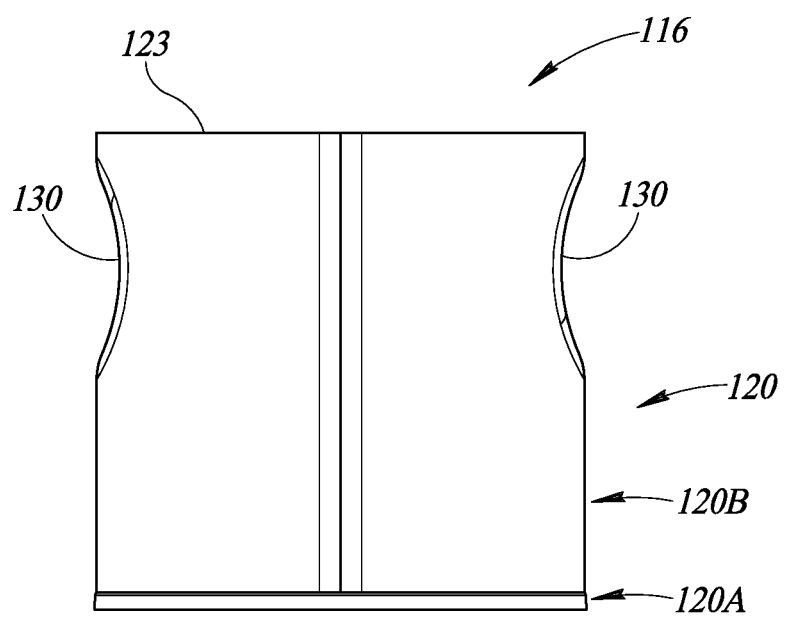
FIG. 6 is an elevational view of the magnetically coupled ground reference probe.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure are directed to systems and methods of providing a magnetically coupled ground reference probe for use with test equipment (e.g., DMMs). The magnetically coupled ground reference probes of the present disclosure may be used instead of a typical test probe or alligator clip. In at least some implementations, a magnetically coupled ground reference probe is provided which includes an insulative housing surrounding a conductive magnet (e.g., permanent magnet, electromagnet). The housing provides insulation between any high potential source and the operator, thus providing a safe way of connecting a ground reference (e.g., panel housing) to the test equipment. In at least some implementations, the magnet may autonomously retract into a cavity of the insulative housing when not coupled to the ground reference so that the conductive magnet does not contact a high potential source when being handled by the operator. In at least some implementations, at least a portion of the insulation material of the housing may be compressible to allow the magnet to come into physical contact with a ground reference surface (e.g., flat surface of a panel housing) while providing a sufficient creepage and clearance path. Advantageously, in at least some implementations the size and dimensions of the insulative housing allow easy handling of the magnetically coupled ground reference probe by an operator while the operator is wearing bulky gloves. Further, the magnet and insulative housing may be sized to minimize the possibility of the probe shorting to an energized circuit if the magnetically coupled ground reference probe becomes loose or is unintentionally dropped by the operator.

FIG. 1 shows an environment 100 in which a measurement device in the form of a DMM 102 may be used by an operator 104 to obtain voltage, current, resistance, or other measurements of a circuit, which may be housed in a grounded panel housing 106. A first electrical test lead 108 may be plugged into a positive receptacle on the body of the DMM 102 and may be considered a positive test lead. A second electrical test lead 110 may be plugged into a negative, neutral, common, or ground receptacle on the body of the DMM 102 and may be considered a ground test lead.

A conventional test lead probe 112 is attached to the positive test lead 108 and is sized and dimensioned to be held by the operator 104 and held in contact with a terminal or contact of a circuit 114 under test. In implementations wherein the DMM 102 is a non-contact voltage measurement system, the DMM may include a front end which includes a sensor (e.g., capacitive sensor) that may be positioned proximate an insulated conductor under test. The ground test lead 110 may be selectively physically and electrically coupled to a magnetically coupled ground reference probe 116 which in turn is selectively physically and electrically coupled to a flat conductive surface 118 of the panel housing 106 that is grounded. Thus, the magnetically coupled ground reference probe 116 provides a ground connection to the DMM 102. As discussed further below, in at least some implementations the magnetically coupled ground reference probe 116 utilizes a magnetic force to retain the magnetically coupled ground reference probe physically and electrically coupled to the flat surface 118 of the panel housing 106 or other grounded ferromagnetic material so that the ground lead 110 may remain coupled to a ground reference "hands free."

Various views of the magnetically coupled ground reference probe 116 ("probe") are shown in FIGS. 1-11. The probe 116 includes a substantially cylindrically-shaped housing 120 (FIG. 2) comprising a base portion 120A and cover portion 120B. In this example, the cover portion 120B includes three wells 119 (see FIGS. 2 and 7) that each extend downward from a top surface 123 of the cover portion. At the bottom of each well 119 there is an opening 121 sized to receive a shaft of a threaded screw 152 or other fastener. The based portion 120A includes three corresponding raised portions 125 that each includes a threaded opening 127 for threadably receiving one of the screws 152 to physically couple base portion 120A to the cover portion 120B. In other implementations, the housing 120 may comprise a unitary piece or may comprise two or more pieces fastened together by any suitable method (e.g., screws, ultrasonic welding).

Figure 7:
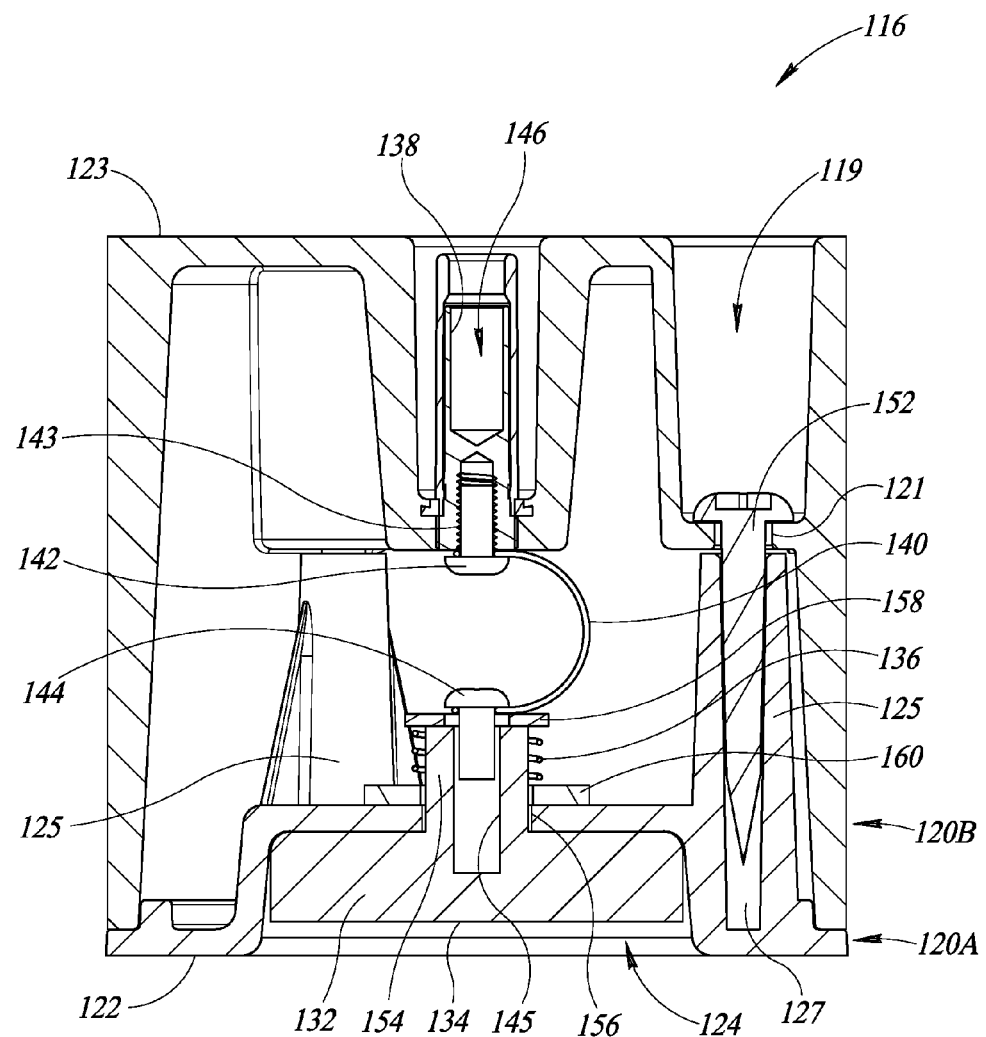
FIG. 7 is a sectional elevational view of the magnetically coupled ground reference probe taken along the line 7-7 of FIG. 4 when a movable magnet of the magnetically coupled ground reference probe is disposed in a raised position.

As shown in FIG. 7, the base portion 120A has a bottom rim or face 122 and a downward facing recess 124 extending upward from the bottom rim into the housing. The housing 120 may be formed from an insulative material (e.g., plastic). The cover portion 120B of the housing 120 may include opposing sidewall recesses or indentations 130 (FIGS. 2, 3 and 6) on the sidewall of the cover portion which allow the user to grasp the housing to selectively remove the probe 116 from a ferromagnetic surface (e.g., surface 118 of FIG. 1) to which the probe is magnetically coupled.

The probe 116 also includes an electrically-conductive magnet 132 movably coupled to the base portion 120A of the housing 120. The magnet 132 may have a planar-shaped bottom face or surface 134, and the magnet may be movable between a raised position (FIG. 7) wherein the bottom face of the magnet is disposed within the recess 124 above the bottom rim 122 and a lowered position (FIG. 8) wherein the bottom face of the magnet is disposed proximate (e.g., at least substantially coplanar) with the bottom rim.

Figure 8:
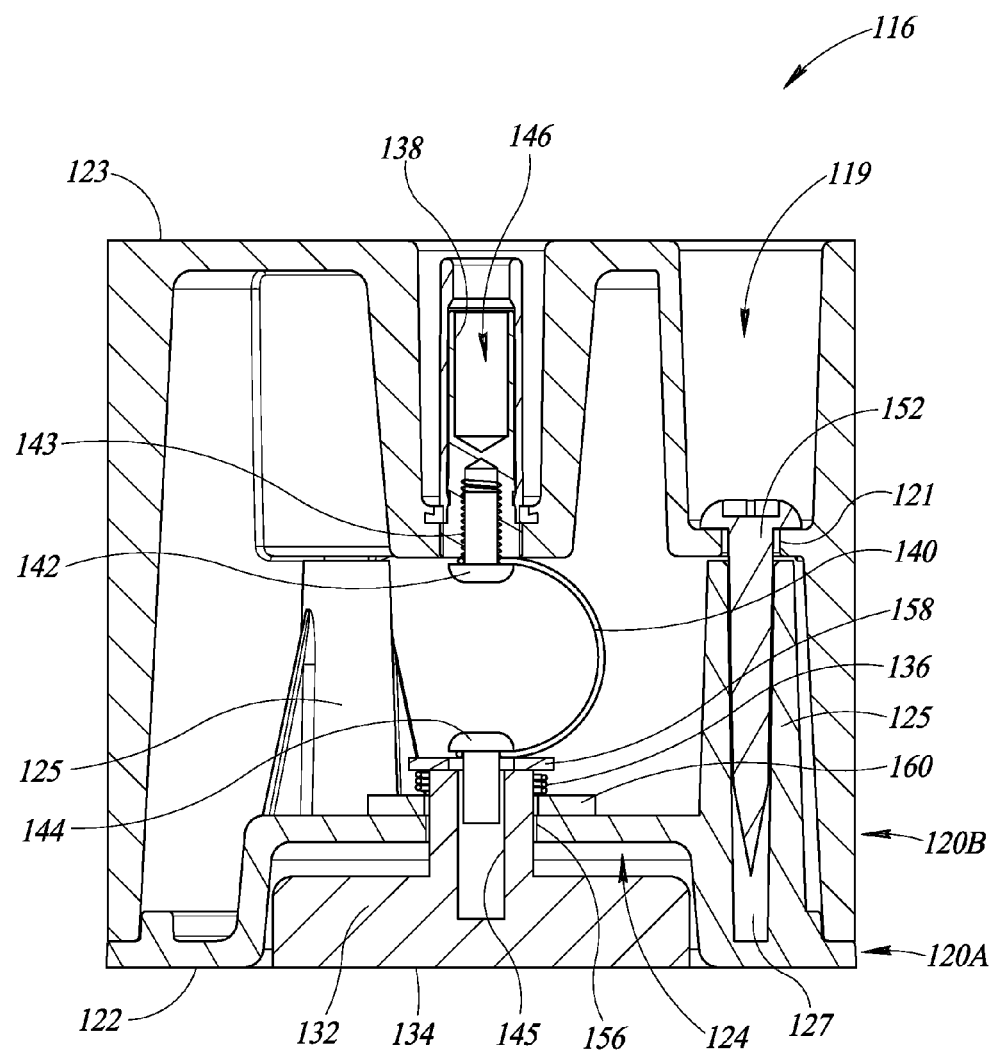
FIG. 8 is a sectional elevational view of the magnetically coupled ground reference probe taken along the line 7-7 of FIG. 4 when the movable magnet of the magnetically coupled ground reference probe is disposed in a lowered position.
Figure 9:
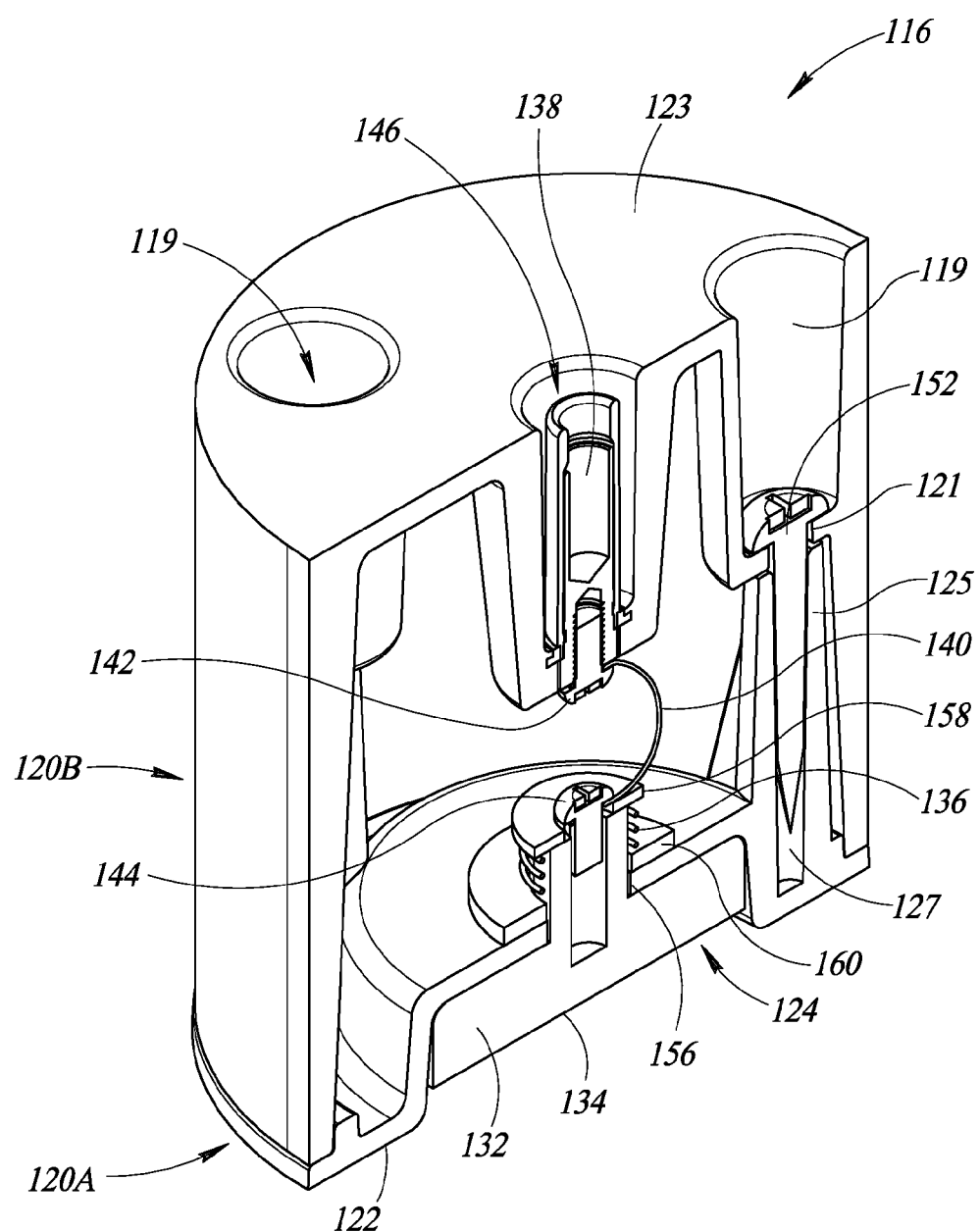
FIG. 9 is a sectional top perspective view of the magnetically coupled ground reference probe taken along the line 7-7 of FIG. 4 when the movable magnet of the magnetically coupled ground reference probe is disposed in the raised position.
Figure 10:
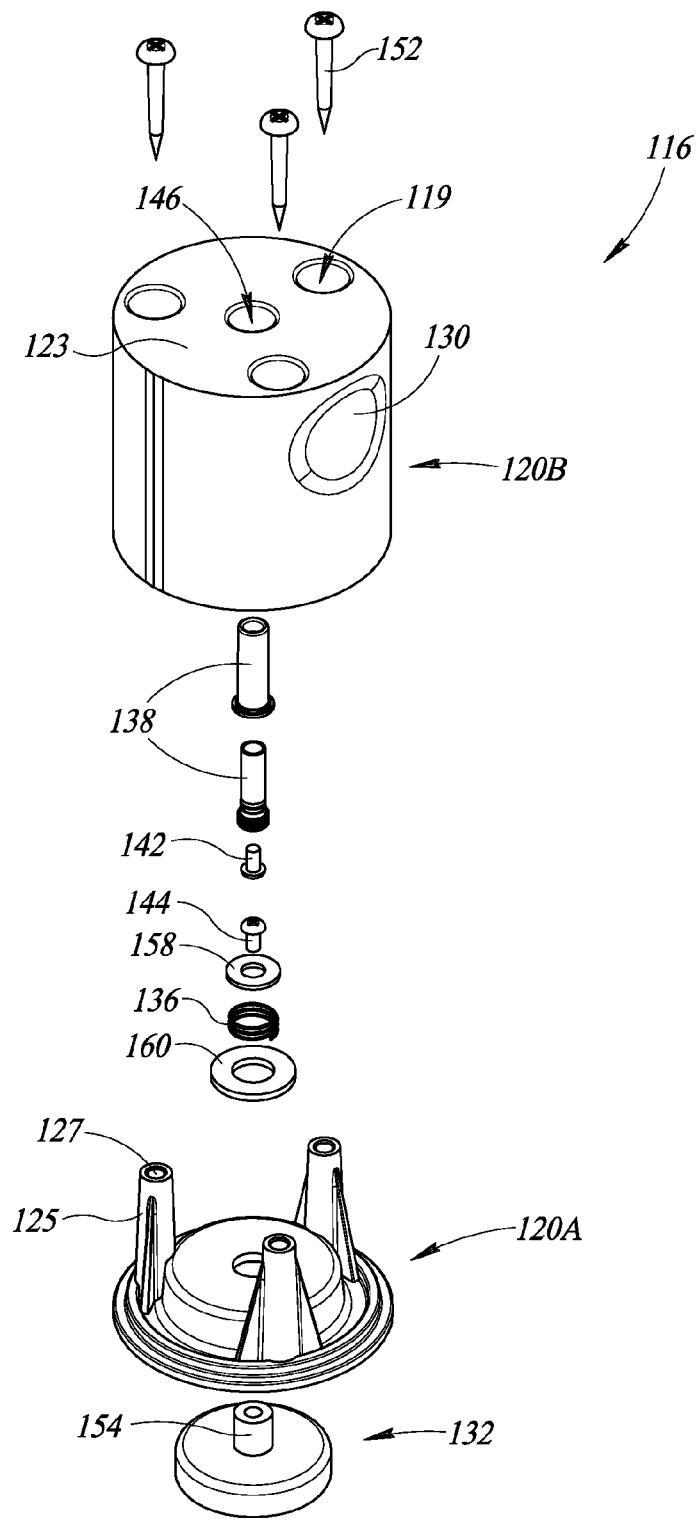
FIG. 10 is an exploded top perspective view of the magnetically coupled ground reference probe showing the various components thereof
Figure 11:
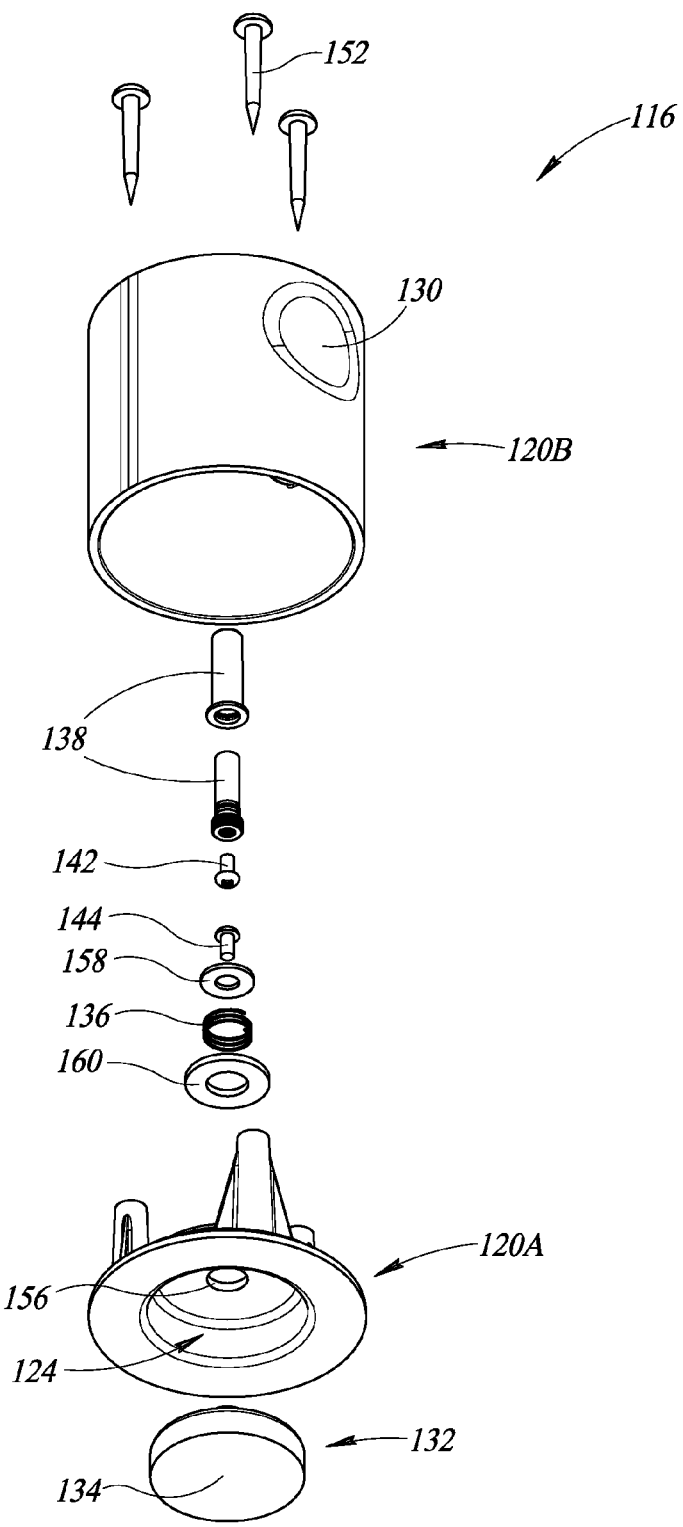
FIG. 11 is an exploded bottom perspective view of the magnetically coupled ground reference probe showing the various components thereof.

The probe 116 may also include a biasing actuator 136 (e.g., compression spring) operatively coupled to bias the magnet 132 in the raised position. The biasing actuator 136 exerts an upward force (as shown in FIGS. 7 and 8) on the magnet 132 which is less than a downward magnetic force exerted on the magnet when the bottom rim 122 of the housing 120 is disposed adjacent a ferromagnetic surface. Thus, the bottom face 134 of the magnet 132 is disposed proximate (e.g., substantially coplanar) to the bottom rim 122 when the bottom rim is positioned adjacent the ferromagnetic surface due to the attractive magnetic force between the magnet and the surface, and the biasing actuator 136 automatically retracts the magnet into the recess 124 upon separation of the probe 116 from the ferromagnetic surface by the operator.

The probe 116 may also include a coupling conductor 138 electrically coupled with the magnet 132. The coupling conductor 138 may be sized and dimensioned to electrically couple with a test lead (e.g., test lead 110 of FIG. 1) which is electrically coupleable with the electronic test equipment (e.g., DMM 102). A flexible wire 140 may electrically couple the coupling conductor 138 to the magnet 132 using screws 142 and 144. The coupling conductor 138 includes a threaded opening 143 which receives the screw 142, and the magnet 132 includes a threaded opening 145 which receives the screw 144. In at least some implementations, at least a portion of the coupling conductor 138 may be molded into a 146 recess in the housing 120.

In at least some implementations, the magnet 132 may have a boss 154 which extends upward through an opening 156 in the recess 124 of the housing 120. The uppermost portion of the boss 154 includes the threaded opening 145 which threadably receives the screw 144. The biasing actuator 136 may be disposed around at least a portion of the boss (e.g., between two washers 158 and 160) to bias the magnet 132 in the raised or recessed position. In this example, the biasing actuator 136 is retained on the boss 154 by the washer 158 which is retained by the screw 144 coupled to the magnet 132.

Figure 12:
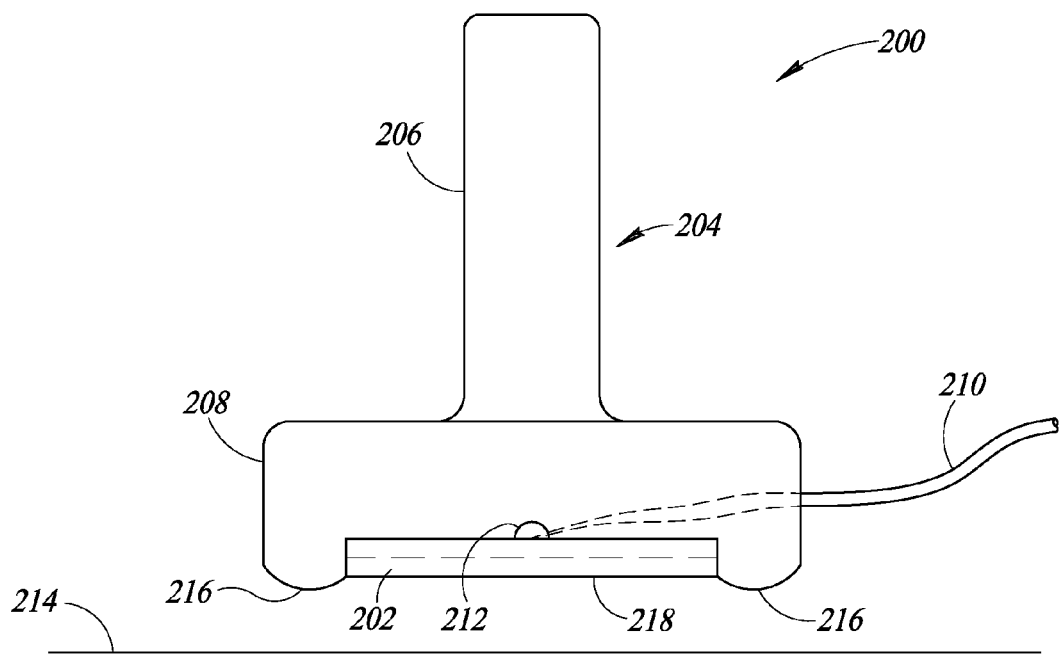
FIG. 12 is an elevational view of a magnetically coupled ground reference probe, according to one illustrated implementation.
Figure 13:
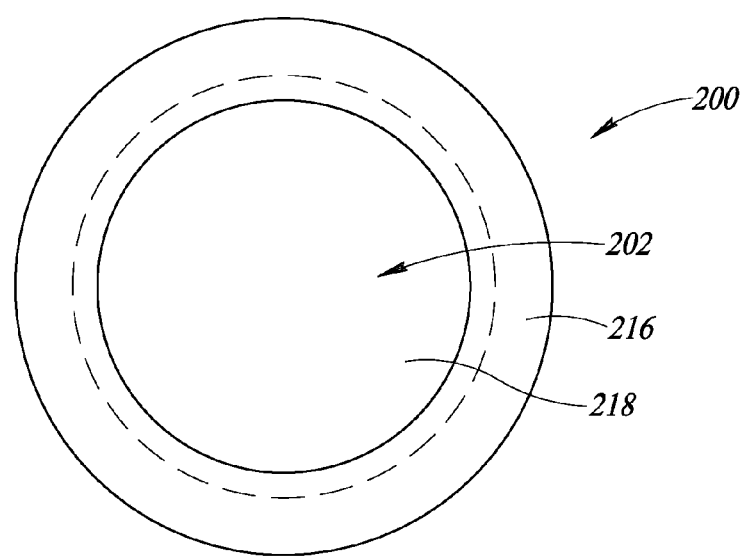
FIG. 13 is a bottom plan view of the magnetically coupled ground reference probe of FIG. 12.
Figure 14:
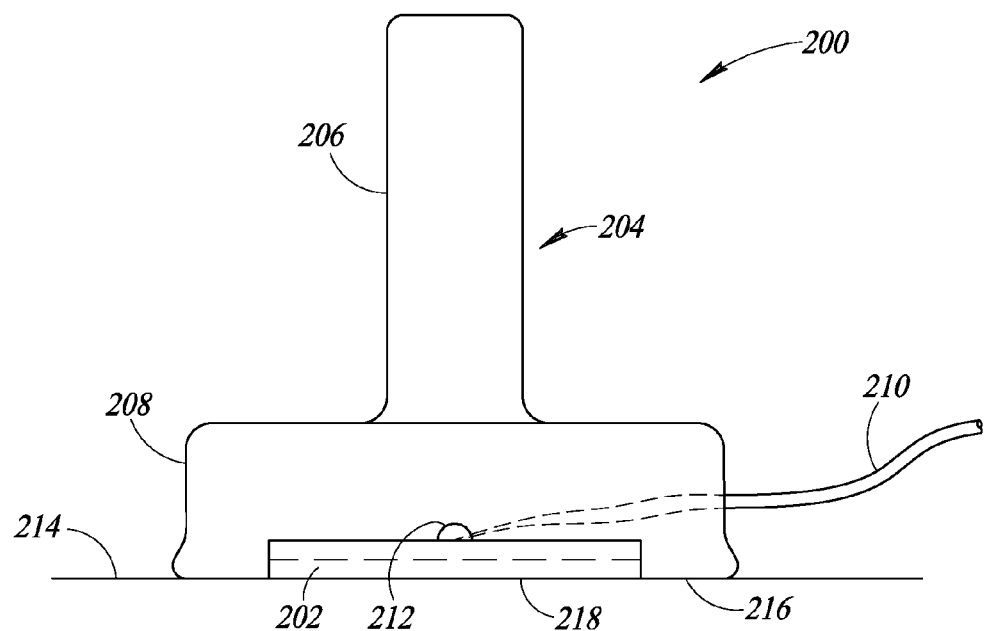
FIG. 14 is an elevational view of the magnetically coupled ground reference probe of FIG. 12 when the magnetically coupled ground reference probe is disposed adjacent a surface of a ferromagnetic material.

FIGS. 12-14 show another implementation of a magnetically coupled ground reference probe 200, according to one illustrated implementation. In this implementation, the probe 200 includes a conductive magnet 202 and a housing 204 at least a portion thereof formed from a compressive, insulative material. The housing 204 includes a handle portion 206 and magnet support portion 208 coupled to a bottom end of the handle portion. The conductive magnet 202 may be coupled to an insulated conductive wire 210 via a conductive contact 212 embedded in the housing 204, for example. When the probe 200 is separated from a ferromagnetic surface 214 as shown in FIG. 12, such as the panel housing 118 of FIG. 1, a bottom surface 218 of the magnet 202 is raised above a lower rim 216 of the housing 204. Such feature allows the user to easily handle the probe 200 while wearing bulky gloves, while minimizing the possibility of the probe shorting to an energized circuit if the probe becomes loose from the electrical equipment to which the probe is attached or is inadvertently dropped by the operator.

As shown best in FIG. 14, when the operator positions the magnet support portion 208 adjacent the ferromagnetic surface 214, the magnet is pulled toward the ferromagnetic surface 214 due to magnetic attraction, which causes the lower rim 216 of the housing 204 to compress to allow the planar bottom surface 218 of the magnet 202 to come into physical contact with the ferromagnetic surface to provide a ground reference. The size, dimensions and compressibility of the lower rim 216 of the housing 204 may be such to provide a sufficient creepage and clearance path.

For a non-contact measurement instrument, an effective ground reference may be achieved via impedance coupling (i.e., combination of capacitance and resistance) between earth ground of the ferromagnetic material (e.g., panel housing 118 of FIG. 1) and the measurement instrument. This may be achieved via the intrinsic body capacitance situated between the hands and feet of the operator. When the user is fully insulated to the degree in which the body capacitance is degraded to a level too small to provide an accurate voltage measurement, the probes 116 or 200 of the present disclosure can be connected between the instrument and a ferromagnetic earth ground surface (e.g., panel housing 118) to provide a suitable ground reference.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of variations or combinations. Those of skill in the art will recognize that many of the methods or algorithms set out herein may employ additional acts, may omit some acts, and/or may execute acts in a different order than specified.

The various implementations described above can be combined to provide further implementations. To the extent that they are not inconsistent with the specific teachings and definitions herein, all of the U.S. patents, U.S. patent application publications, U.S. patent applications, foreign patents, foreign patent applications and non-patent publications referred to in this specification, including U.S. Provisional Patent Application Ser. No. 62/421,124, filed Nov. 11, 2016, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A ground reference probe for use with a measurement device, the ground reference probe comprising:
    a housing having a bottom rim and a downward facing recess extending upward from the bottom rim into the housing, the housing formed from an insulative material;
    an electrically-conductive magnet movably coupled to the housing, the magnet having a bottom face, and the magnet being movable between a raised position wherein the bottom face of the magnet is disposed within the recess above the bottom rim and a lowered position wherein the bottom face of the magnet is disposed proximate to the bottom rim;
    a biasing actuator operatively coupled to bias the magnet in the raised position, the biasing actuator exerting an upward force on the magnet which is less than a downward magnetic force exerted on the magnet when the bottom rim of the housing is disposed adjacent a ferromagnetic material; and
    a coupling conductor electrically coupled with the magnet, the coupling conductor sized and dimensioned to electrically couple with a test lead which is electrically coupleable with the measurement device.

2. The ground reference probe of claim 1 wherein the biasing actuator comprises a compression spring.

3. The ground reference probe of claim 1, further comprising a flexible wire electrically coupled between the coupling conductor and the magnet.

4. The ground reference probe of claim 1 wherein the housing comprises a base portion and a cover portion, the base portion secured to the cover portion by at least one fastener.

5. The ground reference probe of claim 1 wherein the housing has a sidewall that includes opposing recesses which allow an operator to grasp the housing.

6. The ground reference probe of claim 1 wherein the coupling conductor is molded into a recess in a top surface of the housing.

7. The ground reference probe of claim 1 wherein the recess of the housing includes an opening, and the magnet includes a boss which extends through the opening in the recess of the housing.

8. The ground reference probe of claim 7 wherein the biasing actuator comprises a compression spring disposed around at least a portion of the boss.

9. The ground reference probe of claim 8 wherein the boss of the magnet includes an opening, the ground reference probe further comprising a fastener coupled to the magnet via the opening of the magnet, the fastener retaining the compression spring disposed around at least a portion of the boss of the magnet.

10. A measurement device, comprising:
    a measurement device body;
    a ground reference probe, comprising:
        a housing having a bottom rim and a downward facing recess extending upward from the bottom rim into the housing, the housing formed from an insulative material;
        an electrically-conductive magnet movably coupled to the housing, the magnet having a bottom face, and the magnet being movable between a raised position wherein the bottom face of the magnet is disposed within the recess above the bottom rim and a lowered position wherein the bottom face of the magnet is disposed proximate to the bottom rim; and
        a biasing actuator operatively coupled to bias the magnet in the raised position; and
    a test lead which physically and electrically couples the magnet of the ground reference probe to the measurement device body.

11. The measurement device of claim 10 wherein the biasing actuator of the ground reference probe comprises a compression spring.

12. The measurement device of claim 10 wherein the housing of the ground reference probe comprises a base portion and a cover portion, the base portion secured to the cover portion by at least one fastener.

13. The measurement device of claim 10 wherein the housing of the ground reference probe has a sidewall that includes opposing recesses which allow an operator to grasp the housing.

14. The measurement device of claim 10 wherein the recess of the housing of the ground reference probe includes an opening, and the magnet includes a boss which extends through the opening in the recess of the housing.

15. The measurement device of claim 14 wherein the biasing actuator of the ground reference probe comprises a compression spring disposed around at least a portion of the boss.

16. The measurement device of claim 15 wherein the boss of the magnet of the ground reference probe includes an opening, the ground reference probe further comprising a fastener coupled to the magnet via the opening of the magnet, the fastener retaining the compression spring disposed around at least a portion of the boss of the magnet.

17. A ground reference probe for use with a measurement device, the ground reference probe comprising:
   an insulative housing having a base portion and a cover portion, the base portion coupled to the cover portion, the base portion comprising a bottom rim and a downward facing recess extending upward from the bottom rim;
   an electrically-conductive magnet movably coupled to the base portion of the housing, the magnet having a bottom face, and the magnet being movable between a raised position wherein the bottom face of the magnet is disposed within the recess above the bottom rim and a lowered position wherein the bottom face of the magnet is disposed proximate to the bottom rim; and
   a spring operatively coupled to bias the magnet in the raised position.

18. The ground reference probe of claim 17, further comprising a coupling conductor electrically coupled with the magnet, the coupling conductor sized and dimensioned to electrically couple with a test lead which is electrically coupleable with the measurement device.

19. The ground reference probe of claim 18, further comprising a flexible wire electrically coupled between the coupling conductor and the magnet.

20. The ground reference probe of claim 17 wherein the recess of the housing includes an opening, the magnet includes a boss which extends through the opening in the recess of the housing, and the spring is disposed around at least a portion of the boss.

21. The ground reference probe of claim 20 wherein the boss of the magnet includes an opening, the ground reference probe further comprising a fastener coupled to the magnet via the opening of the magnet, the fastener retaining the spring disposed around at least a portion of the boss of the magnet.

* * * * *